(12) United States Patent
Schweichart et al.

(10) Patent No.: US 9,025,319 B2
(45) Date of Patent: May 5, 2015

(54) ADJUSTING DRIVE OF A MOTOR VEHICLE ADJUSTING ELEMENT

(71) Applicant: Brose Fahrzeugteile GmbH & Co. KG Wuerzburg, Wuerzburg (DE)

(72) Inventors: Andreas Schweichart, Veitshoechheim (DE); Peter Klingler, Neubrunn (DE)

(73) Assignee: Brose Fahrzeugeile GmbH & Co. KG Wuerzburg, Wuerzburg (DE)

( * ) Notice: Subject to any disclaimer, the term of this patent is extended or adjusted under 35 U.S.C. 154(b) by 134 days.

(21) Appl. No.: 13/804,356

(22) Filed: Mar. 14, 2013

(65) Prior Publication Data
US 2013/0242484 A1 Sep. 19, 2013

(30) Foreign Application Priority Data

Mar. 14, 2012 (DE) .......................... 10 2012 005 101

(51) Int. Cl.
| | | |
|---|---|---|
| H05K 5/00 | (2006.01) | |
| H05K 7/00 | (2006.01) | |
| G06F 1/16 | (2006.01) | |
| H05K 5/06 | (2006.01) | |
| H02K 11/00 | (2006.01) | |
| H05K 5/03 | (2006.01) | |
| G02B 6/44 | (2006.01) | |

(52) U.S. Cl.
CPC ................ *H05K 5/06* (2013.01); *G02B 6/4444* (2013.01); *H02K 11/0084* (2013.01); *H02K 11/0073* (2013.01); *Y10S 310/06* (2013.01); *H05K 5/03* (2013.01); *H05K 5/0043* (2013.01); *H05K 5/0069* (2013.01)

(58) Field of Classification Search
CPC ........... H02K 11/0073; H02K 11/0084; Y10S 310/06; G02B 6/4444
USPC ........ 361/679.01, 728; 310/68 R; 280/1, 257; 296/146.2; 174/50.5
See application file for complete search history.

(56) References Cited

U.S. PATENT DOCUMENTS

| | | | | |
|---|---|---|---|---|
| 6,756,711 | B2 * | 6/2004 | Matsuyama et al. ........ | 310/68 R |
| 6,831,382 | B1 * | 12/2004 | Lyle et al. ........................ | 310/89 |
| 8,525,379 | B2 * | 9/2013 | Kokubu .......................... | 310/71 |
| 8,710,378 | B1 * | 4/2014 | Iliev et al. ...................... | 174/520 |
| 2002/0163261 | A1 * | 11/2002 | Lin .............................. | 310/68 E |
| 2010/0150517 | A1 * | 6/2010 | Allen et al. ................... | 385/135 |
| 2013/0050966 | A1 | 2/2013 | Frenzel et al. | |
| 2013/0328459 | A1 * | 12/2013 | Blaser ......................... | 310/68 R |

FOREIGN PATENT DOCUMENTS

| | | |
|---|---|---|
| DE | 198 40 014 C1 | 12/1999 |
| DE | 10 2004 011 032 A1 | 4/2005 |
| DE | 10 2006 004 444 B4 | 8/2007 |
| DE | 10 2009 023 323 A1 | 12/2009 |
| WO | WO 2011/035770 | 3/2011 |

* cited by examiner

*Primary Examiner* — Anthony Haughton
(74) *Attorney, Agent, or Firm* — Muncy, Geissler, Olds & Lowe, P.C.

(57) ABSTRACT

An electronics and/or gearing housing, in particular for a worm wheel of a window lifting drive, of a motor vehicle is provided. The electronics and/or gearing housing has a housing body, within which an electronic assembly is arranged, and a cover, which is joined to the housing body via ultrasonic welding.

15 Claims, 3 Drawing Sheets

ADJUSTING DRIVE OF A MOTOR VEHICLE ADJUSTING ELEMENT

This nonprovisional application claims priority under 35 U.S.C. §119(a) to German Patent Application No. DE 10 2012 005 101.8, which was filed in Germany on Mar. 14, 2012, and which is herein incorporated by reference.

BACKGROUND OF THE INVENTION

1. Field of the Invention

The invention relates to an adjusting drive of an adjusting element of a motor vehicle, comprising a housing, within which an electronic assembly and in particular a worm wheel of a window lifting drive are arranged.

2. Description of the Background Art

An electronic assembly or electronic component of a motor vehicle is usually protected from damage by means of a housing. Such damage is caused for example by mechanical effects or vibration. Furthermore, weathering influences may adversely affect the operation of the electronic assembly or the electronic components. Such weathering influences occur in particular when the electronic assembly is positioned in the so-called wet area of the motor vehicle. This is located for example in the outer region of a vehicle door, inside the engine compartment or in the region of the vehicle wheels. The weathering influences take the form of spray water that gets into the bodywork.

Conventionally, such a housing has a housing body and a cover attached to the housing body with interlocking and/or frictional engagement. Clips or screws are used for example for this. The cover is produced from plastic or metal components, one of the materials being comparatively stiff and being used to create a receiving location for the screws or the like. The remaining part of the cover is produced from another, comparatively flexible and low-cost material, in order to avoid cracking of the cover under vibration. A disadvantage of this is that the cover is comparatively cost-intensive and cannot be produced together with the housing in a single operation. Furthermore, additional means of attachment have to be used for the mounting of the housing.

SUMMARY OF THE INVENTION

It is therefore an object of the invention to provide a particularly suitable adjusting drive with a comparatively low-cost electronics and gearing housing.

As a component part preferably of a window lifting drive, and consequently of a window lifting mechanism of a motor vehicle, the housing is for example integrally formed on a covering of a gear mechanism of the drive, and in particular is in one piece with it. The gear mechanism is, for example, a so-called worm wheel gearing of the window lifting drive. The housing has a housing body, which is closed by means of a cover. The cover is attached to the housing body by means of ultrasonic welding.

Expediently, the housing body and the cover respectively can be formed of a single plastic, the plastic of the cover preferably being comparatively flexible. The cover is advantageously produced from the same material as the housing body, so that a connection between the housing body and the cover comprising a material bond is obtained by means of the ultrasonic welding. Consequently, after the cover has been mounted on the housing body, the housing is substantially of one piece in material terms.

In this way, mounting of the cover on the housing body is possible comparatively easily, no additional elements such as screws or clips being required. Similarly, the connection is comparatively stable, so that the housing can be used in the motor vehicle without the connection becoming disconnected. Furthermore, if just one material is used for the housing body and the cover, a further cost saving is made possible and these two component parts can be produced in one operation, for example by means of injection-molding technology.

An electronic assembly is arranged within the cavity formed by the cover and the housing body. The gearing or a component driving the gearing, such as for example an electric motor, is expediently controlled by means of the electronic assembly. For example, the electronic assembly is a printed circuit board with electronic devices and/or components, and in particular the electronic assembly extends substantially parallel to the plane of extent of the cover.

The electronic assembly can be substantially hermetically surrounded by the cover and the housing body. Any connecting cables may be led to the electronic assembly through openings in the housing. These openings may be sealed off here by means of an additional rubber or plastic element, or in particular the plastics compound of the housing body. This makes an electronic assembly suitable for positioning in a so-called wet area of the motor vehicle, avoiding any impairment of the operation of the electronic assembly.

Within the housing there is at least one electrical contact terminal, by means of which the electronic assembly is electrically contacted. The contact terminal is in electrical contact here with the component that is controlled by means of the electronic assembly, that is to say for example with an electric motor. The electrical contact terminal has in particular been introduced into the housing body during the production thereof. For example, during the production of the housing body, the already existing electrical contact terminal is at least partially encapsulated by the plastics compound that later forms the housing body.

The electronic assembly has a terminal corresponding to the electrical contact terminal, for example in the form of a hole or an opening lined with electrically conductive material. For mounting, the terminal of the electronic assembly is positioned above the contact terminal of the housing, and the electronic assembly is pressed onto the contact terminal. If the terminal is a hole, the diameter of the hole is preferably smaller than a connector of the contact terminal corresponding thereto. In this way, the connector is at least partially plastically deformed, and the electrical contact between the contact connector and the electronic assembly is of comparatively low resistance. In other words, the electronic assembly is brought into electrical contact with the contact terminal and positioned in the housing by means of a so-called press-fit technique.

The cover comprises a preferably pin-shaped dome, which is directed toward the electronic assembly. Particularly preferably, the dome is integrally formed on the cover and in one piece with it. This makes it possible to produce the dome together with the cover in one operation, which leads to a cost saving. By means of the dome, the electronic assembly is prevented from hitting the cover if it has come away from the mounted position, for example as a result of vibration. For this reason, there is expediently no electronic component at that location of the electronic assembly that is closest to the dome, or in the vicinity thereof. For example, the dome is arranged at a distance from the periphery of the cover, and in particular the cover has a number of domes.

The diameter of the dome suitably decreases as the distance from the electronic assembly decreases. In other words, the dome tapers toward the electronic assembly. For example, the cross section of the dome is circular in a sectional area that is substantially parallel to the cover. Consequently, the dome is of a conical or frustoconical design. In this way, the dome is comparatively securely connected to the cover and is comparatively flexible in the region of the electronic assembly. Consequently, when there is a movement of the electronic assembly toward the cover, the dome can be elastically deformed by the electronic assembly, for which reason the movement of the electronic assembly is retarded comparatively gently. This prevents damage to the electronic assembly. Furthermore, the mechanical contact between the dome and the electronic assembly is reduced, for which reason the free area of the electronic assembly that is intended for this contact and is free from electronic components can be made comparatively small in size.

In the mounted state, the dome lies in frictional engagement with the electronic assembly and consequently serves as a hold-down device for the electronic assembly. In other words, the electronic assembly is stabilized by means of the dome, in order to prevent movement of the electronic assembly toward the cover. Consequently, the electronic assembly is subjected to comparatively little loading during the operation of the motor vehicle. It is also possible by means of the dome to create a minimum distance between the electronic assembly or the electronic components thereof and the cover that is necessary and/or prescribed for reliable operation. The electronic assembly preferably rests on a means of attachment that is integrally bonded or formed on the housing body, and the electronic assembly is held between the means of attachment and the dome with frictional engagement. In this way, a comparatively low-cost attachment of the electronic assembly in the housing is possible.

In an embodiment that may also be provided in combination by the provision of a further dome, the electronic assembly has been introduced into an opening within which the dome is at least partially arranged. In other words, this dome protrudes from the side of the electronic assembly that is facing the cover through the opening to the side of the electronic assembly that is facing away from the cover. In this way, movement of the electronic assembly perpendicularly to the dome is avoided. There is consequently no need for any further stabilizing elements.

Expediently, the free end of the dome, that is to say that region of the dome that is located on the side of the electronic assembly that is facing away from the cover, is arranged here in a mating holder of the housing body. The mating holder is, in particular, a one-piece component part of the housing body and the electronic assembly is advantageously placed on the mating holder. In other words, the mating holder determines the position of the electronic assembly. The free end of the dome is fused together with the mating holder, this fusion expediently taking place in the operation in which the cover is attached to the housing body. In other words, the dome is attached to the mating holder by means of ultrasonic welding. By means of this type of positioning, the electronic assemblies can also be reliably positioned within the housing if, as a result of structural conditions, no energy, in particular thermal energy, is allowed to be introduced into the housing during the attachment.

Here, the maximum diameter of the dome is for example smaller than the diameter of the opening introduced into the electronic assembly. The positioning of the electronic assembly within the housing consequently takes place substantially by means of the mating holder, and there is no force applied by the dome to the electronic assembly.

By means of the drive, an adjusting element of a motor vehicle is moved along on adjustment path. The adjusting element is, in particular, a window and the adjusting drive is consequently on electromotive window lifting drive. The electronic assembly of the drive is arranged within the housing. The drive is preferably controlled by means of the electronic assembly.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Parts that correspond to one another are provided with the same designations in all of the figures.

Figure 1:
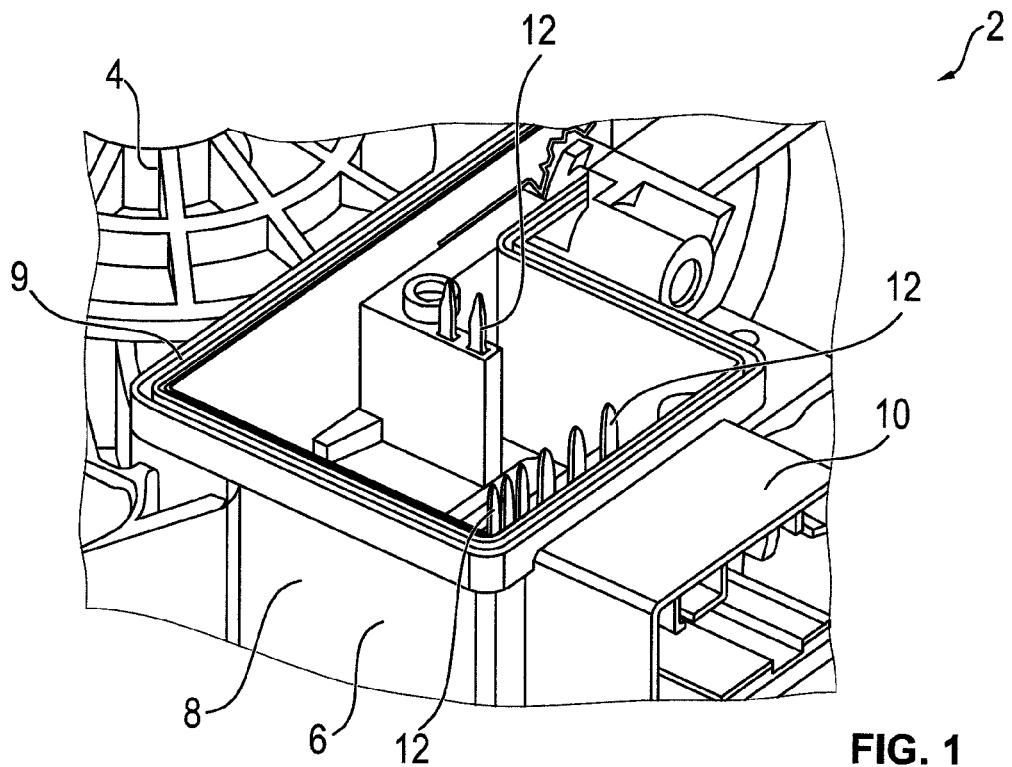
FIG. 1 perspectively shows a gearing housing of an adjusting drive without an electronic assembly.

In FIG. 1, a drive 2 of a window lifting mechanism of a motor vehicle is shown as a detail in a perspective representation. The drive 2 comprises a gearing 4, in the embodiment of a so-called worm wheel, which is shown here in the form of a detail. By means of the gearing 4, a rotational movement of an electric motor (not shown) is converted into a translational movement of the window pane of the window lifting mechanism. A housing body 6 of a gearing housing 8 is molded onto the plastic covering of the gearing 4. The housing body 6 has a hollow-cylindrical form with an L-shaped base area, one of the base areas being integrally formed on the hollow cylinder. In the periphery of the lateral surface of the housing body 6, a groove 9 facing away from the base area has been introduced around it.

Protruding into the housing body 6 are a number of electrical contacts, which are in electrical contact with a plug-in connection 10 lying outside the housing body 6 and end in a number of electrical contact terminals 12. The electrical contacts are completely surrounded by plastic in the region of the housing body 6, so that the housing body has a waterproof vessel-like form. Connected to the plug-in connection 10 in the mounted state of the drive 2 is a cable, which for its part is in electrical contact with a car battery, the electric motor of the drive 2, a control device and/or sensors.

Figure 2:
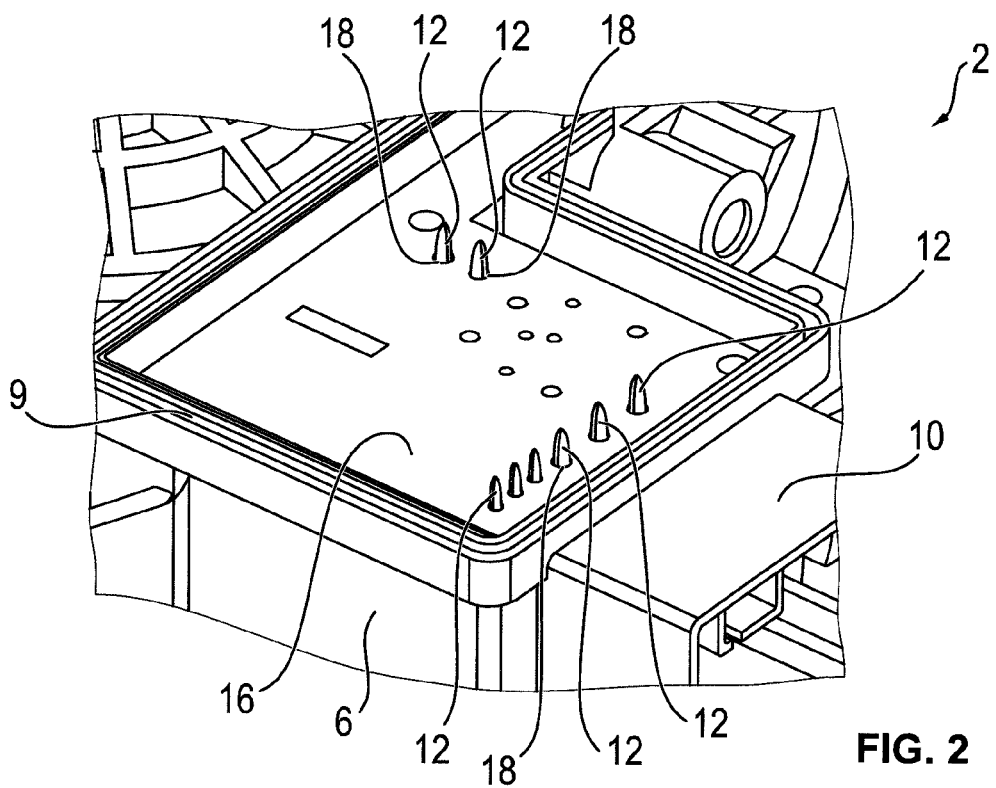
FIG. 2 shows the gearing housing according to FIG. 1 with an electronic assembly.
Figure 3:
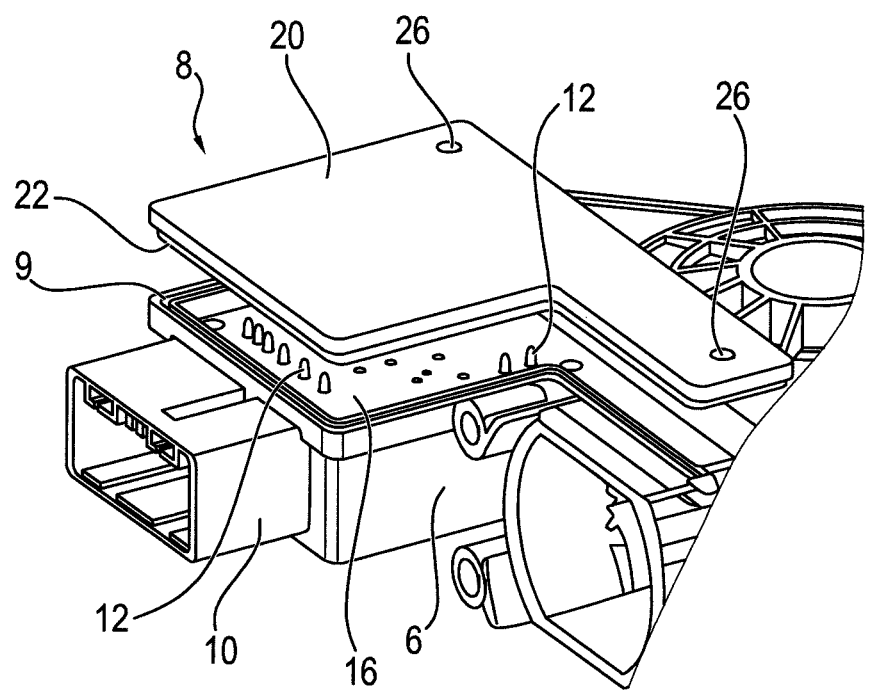
FIG. 3 perspectively shows the gearing housing with a cover.

In a next mounting step, represented in FIG. 2, an electronic assembly 16 is arranged within the housing body 6. For this purpose, the electronic assembly 16, which substantially includes a printed circuit board, has a number of terminal locations 18 corresponding in number to the electrical contact terminals 12 of the gearing housing 8. The terminal locations 18 are substantially openings within the printed circuit board that are lined with an electrically conductive material, and which are in electrical contact with conductor tracks (not represented) or electronic components of the electronic assembly 16. The diameter of the terminal openings 18 is smaller here than the diameter of the contact terminals 12. In the case of the so-called press-fit method, the electronic assembly is pressed onto the contact terminals 12. For this purpose, the contact terminals 12 engage in the corresponding terminal locations 18 and are at least partially plastically deformed. In this way, the electrical contact is made between the respective terminal location 18 and the associated contact terminal 12 and is of comparatively low resistance. Furthermore, there is no corrosion, or only comparatively little corrosion, in the junction region.

As soon as the electronic assembly 16 is in electrical contact with the contact terminals 12 and positioned as desired, the housing body 6 is covered with a cover 20. For this purpose, a lug 22 integrally formed on the cover 20 in the peripheral region thereof engages in a groove 9 corresponding thereto in the housing body 6. When the lug 22 is lying in the groove 9, these are both heated by means of ultrasonic welding, and consequently a material engagement is established between the cover 20 and the housing body 6. As a result, the electronic assembly 16 is substantially hermetically sealed off within the electronics and gearing housing 8. It is only possible to send electrical signals to the electronic assembly 16 via the connector. In this way, the electronic assembly 16 is protected from weathering effects and spray water, for which reason the drive 2 can be fitted in the so-called wet area of the motor vehicle.

The cover 20 has substantially the material of the housing body 6 and comprises two domes 24 (FIGS. 4a to 4e), which are integrally formed on said housing body at specific locations 26. The domes 24 are located here on the side of the cover 20 that is facing the electronic assembly 16, and have either been molded in one piece with the cover 20 during the production thereof or have been created subsequently at the locations 26 by means of deforming the cover 20.

Figure 4A:
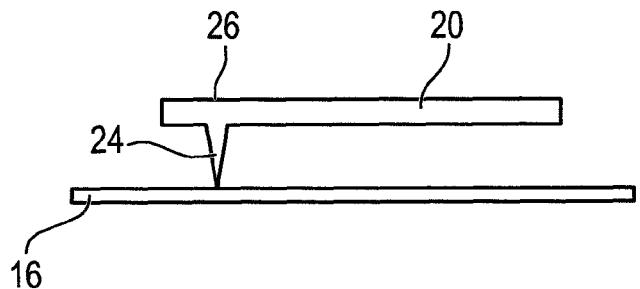
FIG. 4a-4e schematically show alternative embodiments of the cover, in each case in a sectional representation.

In FIG. 4a, a first embodiment of the dome 24 is shown. The dome 24 has a conical shape and is arranged substantially perpendicularly to the cover 20. The cover 20 is in turn arranged substantially parallel to the electronic assembly 16, for which reason the dome 24 is also arranged perpendicularly to the electronic assembly 16. The tip of the dome 24, tapering toward the electronic assembly 16, lies against the electronic assembly 16 with frictional engagement. In this way, slipping of the electronic assembly 16 along the contact terminals 12 in the direction of the cover 20 is avoided, which stabilizes the position of the electronic assembly 16 within the housing 8. Furthermore, the distance between the electronic assembly 16 and cover 20 is determined by means of the dome 24. As a result, reliable operation of the electronic assembly 16 is ensured, since a minimum distance between electronic components of the electronic assembly 16 and the cover 20 is maintained, and consequently a short-circuit is prevented. What is more, excessive heating of the cover 20 as a result of heat generated by the electronic assembly 16 is avoided in this way.

Figure 4B:
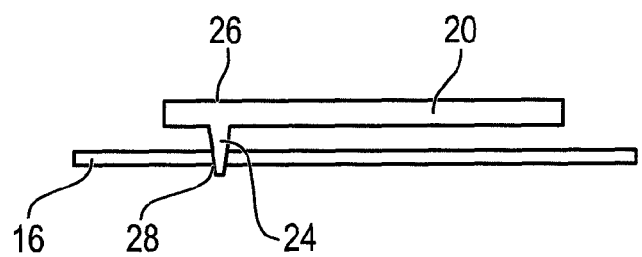

FIG. 4b shows an embodiment as an alternative to this. By contrast with the dome 24 shown in FIG. 4a, this dome is of a frustoconical configuration. Furthermore, the electronic assembly 16 has an opening 28, the form of which corresponds substantially to a scaled cross section of the dome 24. The dome 24 is partially arranged within the opening 28. In other words, the dome 24 protrudes from the side of the electronic assembly 16 that is facing the cover 20 through the latter to the opposite side. The diameter of the opening 18 is larger here than the cross section of the dome 24 at the tip thereof, but smaller than the diameter of the maximum cross section thereof. Consequently, the dome 24 can be inserted comparatively unproblematically into the opening 28 in the electronic assembly 16, while nevertheless a movement of the electronic assembly 16 toward the cover 20 is prevented as a result of the widened cross section of the dome 24. Therefore, a movement of the electronic assembly 16 both in the direction of the cover 20 and in a plane substantially parallel to the cover 20 is prevented by means of this embodiment.

Figure 4C:
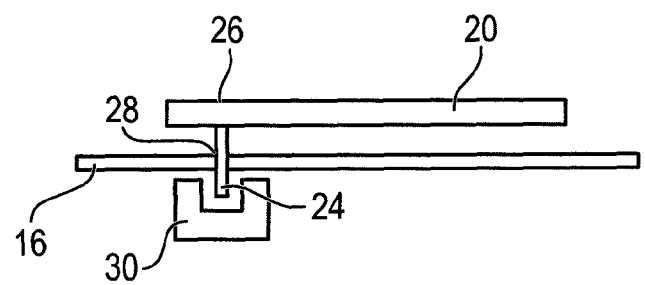

For further stabilization, the dome 24 may be arranged at the free end in a mating holder 30, as shown in the third embodiment in FIG. 4c. The mating holder 30 is a component part of the housing body 6 and is arranged on the side of the electronic assembly 16 that is opposite from the cover 20. During the mounting of the electronic assembly 16, it is placed on the mating holder 30. During the ultrasonic welding, the mating holder 30 is connected to the dome 24 in material terms, and consequently the electronic assembly 16 is fixed in the gearing housing 8. For easier handling, the diameter of the dome 24 is smaller here than the diameter of the opening 28. Furthermore, the dome 24 is cylindrical or cuboidal, although it may also be conical or frustoconical.

Figure 4D:
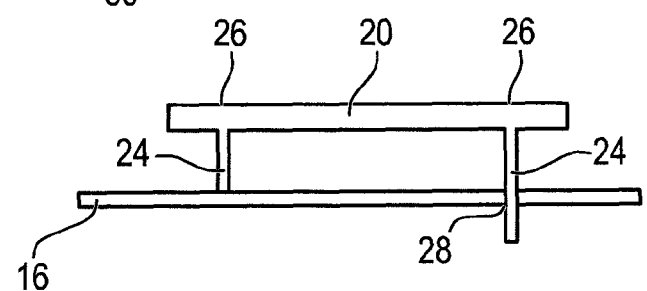

A fourth embodiment is represented in FIG. 4d. In the case of this embodiment, two domes 24 are integrally formed on the cover 20, one of which lies against the electronic assembly 16 with frictional engagement and the other protrudes through the opening 28 in the electronic assembly 16. By means of this type of positioning, a movement of the electronic assembly 16 toward the cover 20 is prevented by the dome 24 lying against the electronic assembly 16 with frictional engagement, while the remaining dome 24 prevents a translational movement of the electronic assembly 16 in a plane parallel to the cover 20.

Figure 4E:
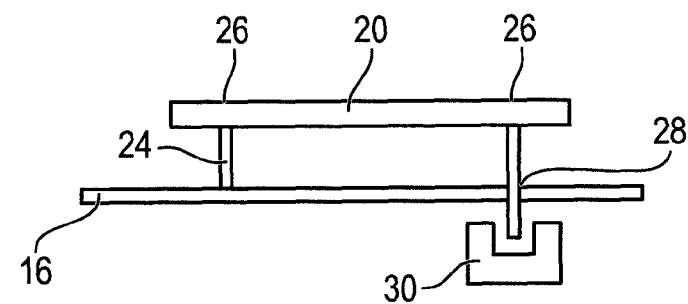

If the structural conditions of the electronic assembly 16 or of the cover 20 do not allow a dome 24 that is unsupported at the free end and protrudes through the electronic assembly 16, the positioning of the electronic assembly 16 may take place on the basis of the method of implementation that is shown in FIG. 4e. In a way comparable to the third exemplary embodiment, the free end of the dome 24 protruding through the electronic assembly 16 engages here in the mating holder 30 of the housing body 6 and is ultrasonically welded to it in the mounted state. In this way, the dome 24 can have comparatively small dimensions, but even so a translational movement of the electronic assembly 16 parallel to the cover 20 is prevented. The remaining dome 24, which lies against the electronic assembly 16 with frictional engagement, in turn prevents a movement of the electronic assembly 16 toward the cover 20.

The invention is not restricted to the embodiments described above. Rather, other variants of the invention may also be derived therefrom by a person skilled in the art without departing from the subject matter of the invention. In particular, furthermore, all of the individual features described in connection with the exemplary embodiments can also be combined with one another in some other way without departing from the subject matter of the invention.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:
1. An adjusting drive of an adjusting element of a motor vehicle, the adjusting drive comprising:
a housing with a housing body, within which an electronic assembly is arranged; and a cover that is joined to the housing body via ultrasonic welding, the cover positioned so as to be substantially parallel to the electronic assembly and the cover having a dome projecting from an inner surface thereof in a direction substantially perpendicular to the electronic assembly, such that the dome is directed toward the electronic assembly, wherein the dome lies against the electronic assembly with frictional engagement and presses the electronic assembly onto at least one electrical contact terminal.

2. The adjusting drive as claimed in claim 1, wherein the dome is integrally formed on the cover.

3. The adjusting drive as claimed in claim 1, wherein the electronic assembly is substantially hermetically sealed via the housing body and the cover.

4. The adjusting drive as claimed in claim 1, wherein the dome tapers as a distance from the electronic assembly decreases.

5. The adjusting drive as claimed in claim 1, wherein the dome is conical or frustoconical.

6. The adjusting drive as claimed in claim 1, wherein the dome protrudes through an opening in the electronic assembly.

7. The adjusting drive as claimed in claim 6, wherein a free end of the dome engages in a mating holder of the housing body and is fused together with the mating holder.

8. The adjusting drive as claimed in claim 6, wherein a diameter of the opening is smaller than a maximum diameter of the dome.

9. The adjusting drive as claimed in claim 1, wherein the housing is an electronics and gearing housing for the electronic assembly and for a worm wheel or crossed helical gear of a window lifting drive of a motor vehicle.

10. The adjusting drive as claimed in claim 1, wherein the entire dome and the cover are formed of a same material.

11. The adjusting drive as claimed in claim 1, wherein the dome directly contacts the electronic assembly.

12. The adjusting drive as claimed in claim 6, wherein the opening passes entirely through the electronic assembly, such that a free end of the dome passes through the opening and extends outside the opening.

13. The adjusting drive as claimed in claim 7, wherein the cover is positioned so as to face an upper surface of the electronic assembly and the mating holder is positioned so as to face an opposing bottom surface of the electronic assembly, such that the electronic assembly is positioned between the cover and the mating holder.

14. The adjusting drive as claimed in claim 6, further comprising a second dome that directly contacts an upper surface of the electronic assembly, such that the cover includes the dome that protrudes through the opening in the electronic assembly, to thus prevent translational movement of the electronic assembly, and the second dome that directly contacts the upper surface of the electronic assembly, to thus prevent movement of the electronic assembly in a direction towards the cover.

15. An adjusting drive of an adjusting element of a motor vehicle, the adjusting drive comprising:

a housing with a housing body, within which an electronic assembly is arranged; and a cover that is joined to the housing body, the cover positioned so as to be substantially parallel to the electronic assembly and the cover having a dome projecting from an inner surface thereof in a direction substantially perpendicular to the electronic assembly, such that the dome is directed toward the electronic assembly, wherein the dome directly contacts the electronic assembly.

* * * * *